(12) United States Patent
Launay et al.

(10) Patent No.: US 7,584,537 B2
(45) Date of Patent: Sep. 8, 2009

(54) METHOD FOR MAKING A MICROCIRCUIT CARD

(75) Inventors: François Launay, Epron (FR); Jérôme Bouvard, Ouistreham (FR)

(73) Assignee: Oberthur Card Systems SA, Paris (FR)

( * ) Notice: Subject to any disclaimer, the term of this patent is extended or adjusted under 35 U.S.C. 154(b) by 0 days.

(21) Appl. No.: 10/499,359

(22) PCT Filed: Dec. 18, 2002

(86) PCT No.: PCT/FR02/04426

§ 371 (c)(1),
(2), (4) Date: Jan. 31, 2005

(87) PCT Pub. No.: WO03/052822

PCT Pub. Date: Jun. 26, 2003

(65) Prior Publication Data

US 2005/0223550 A1    Oct. 13, 2005

(30) Foreign Application Priority Data

Dec. 19, 2001   (FR) .................................. 01 16483

(51) Int. Cl.
*H05K 3/30* (2006.01)
*H01L 21/00* (2006.01)
(52) U.S. Cl. ............................. 29/841; 29/830; 29/832; 438/106

(58) Field of Classification Search .................... 29/830, 29/832, 841; 438/106
See application file for complete search history.

(56) References Cited

U.S. PATENT DOCUMENTS

| 5,026,452 A |   | 6/1991  | Kodai                     |
|-------------|---|---------|---------------------------|
| 5,514,240 A |   | 5/1996  | Hagiiiri-Teiirani         |
| 5,647,122 A | * | 7/1997  | Launay et al. ..... 29/840 |
| 5,817,207 A | * | 10/1998 | Leighton ..... 156/298     |
| 5,850,690 A | * | 12/1998 | Launay et al. ..... 29/841 |
| 5,852,289 A | * | 12/1998 | Masahiko ..... 235/492     |
| 6,241,153 B1|   | 6/2001  | Tiffany, III              |
| 6,372,541 B1| * | 4/2002  | Bouchez et al. ..... 438/106 |
| 6,513,718 B1|   | 2/2003  | Bouchez et al.            |

FOREIGN PATENT DOCUMENTS

| EP | 0 370 114    |   | 5/1990  |
|----|--------------|---|---------|
| EP | 1 050 844    |   | 11/2000 |
| FR | 2793331      | * | 11/2000 |
| JP | 09-048190    |   | 2/1997  |
| JP | 2000-090226  |   | 3/2000  |
| JP | 2001-014442  | * | 1/2001  |

* cited by examiner

*Primary Examiner*—C. J Arbes
(74) *Attorney, Agent, or Firm*—Young & Thompson

(57) ABSTRACT

A method for mounting a microcircuit module in a card body to make the card non-detachable without damage includes fixing the module (22) in a cavity (12) of the card body (11) with a resin after adjusting the adherence of the resin (30) on the wall of the cavity (12) so that it is markedly higher than its adherence on the module (22).

26 Claims, 2 Drawing Sheets

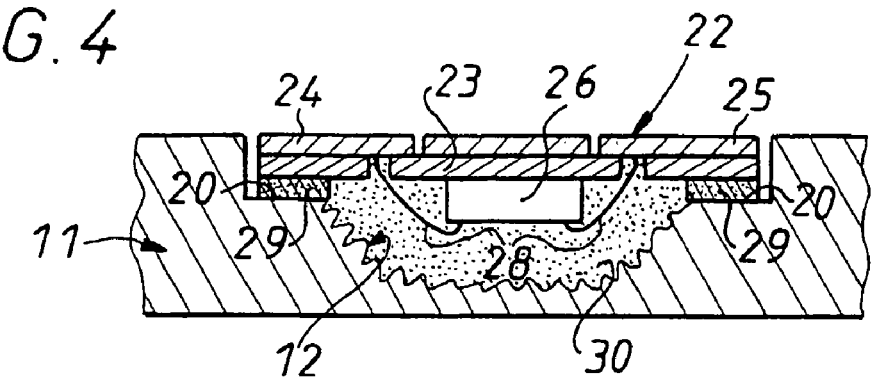
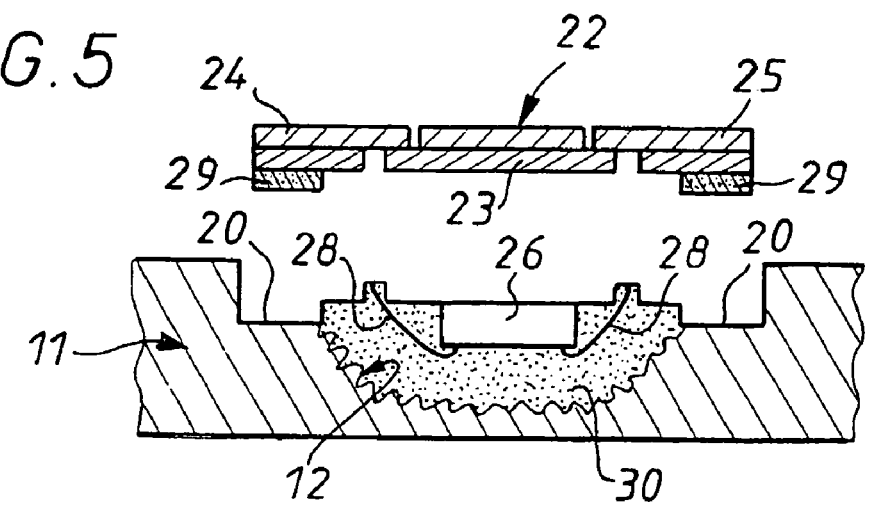
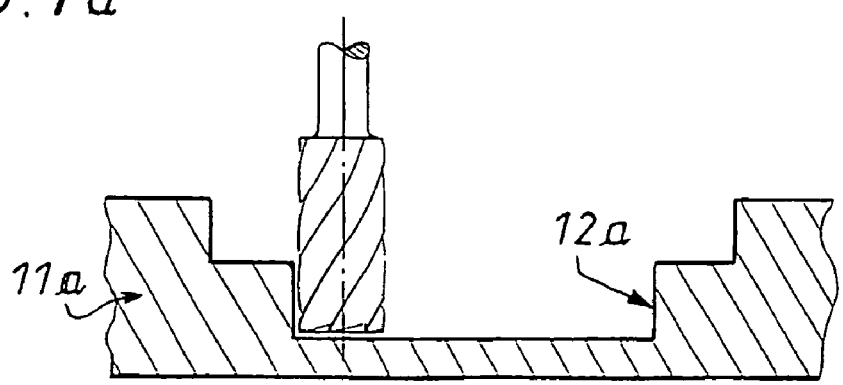

METHOD FOR MAKING A MICROCIRCUIT CARD

BACKGROUND OF THE INVENTION

The invention relates to a method for making a microcircuit card comprising a support card and a module carrying the microcircuit, the module being installed in an open cavity in said support card. A more particular object of the invention is to combat a type of fraud consisting of demounting a module of this kind without affecting its functions, in order to transplant it into another support card.

The development of microcircuit cards in all fields is constantly calling into question security criteria. One of these criteria is the fact that any attempt to extract the module from the support card must lead to failure, i.e. to destruction of the microcircuit and/or its connections. The need to make progress in this field is keenly felt, especially since producing microcircuit identity cards has been envisaged.

The module that is installed in the cavity in the support card comprises a support film forming a printed circuit and carrying the microcircuit on one side. In most of the technologies currently used it is possible to demount the module without destroying it. This is because the module is often stuck to a peripheral flat defined between the open side and the bottom of the cavity, the microcircuit, which is often coated, being housed in the cavity itself. It is relative easy to insert a tool between the edge of the cavity and that of the module, to detach the latter. If this is done carefully, separation does not lead to the destruction of the microcircuit and/or its connections. Adding a drop of adhesive to connect the bottom of the cavity to the coating of the microcircuit has been proposed. However, demounting remains possible if a tool can be inserted between the resin of the coating and the adhesive. Another technique, proposed by the applicant, consists in depositing the resin protecting the microcircuit into the cavity itself and coating the microcircuit with this resin before the resin is polymerized. This technique makes the module more difficult to demount but the results are difficult to control since they depend greatly on the adherence of the resin to the walls of the cavity and in particular to its bottom. The invention aims to improve this technique.

SUMMARY OF THE INVENTION

The invention relates more particularly to a method of making a microcircuit card comprising a card body and a module comprising a support film forming a printed circuit carrying said microcircuit on one of its faces, wherein said module is fixed into a cavity in said card body by means of a resin at least partly filling said cavity and surrounding said Microcircuit, characterized in that the adherence of the resin to the wall of the cavity is increased so that it is significantly greater than its adherence to the support film of said module.

The adherence of the resin may be modified by appropriate surface treatment of the walls of the cavity and more particularly of its bottom. This surface treatment, which is reflected in an increase in the roughness and/or in a chemical modification of the treated surface, very significantly increases the adherence of the resin to the treated surface and in particular makes it very much stronger than the adherence of the same resin to the support film of the module. This being so, in the event of a fraudulent attempt to demount the module by inserting a tool between the edge of the cavity and that of the module the force applied results at best in unsticking the support film from the resin, the microcircuit and its connecting wires remaining embedded in the resin attached to the cavity. Consequently, the module demounted in this way becomes unusable.

The success of this type of surface treatment depends in particular on controlling the settings of the surface treatment means.

Paradoxically, in the context of developing the invention, it has been possible to show that it is preferable to make the card body from a plastic material having a low surface energy (typically less than 45 mN/m), i.e. one having an intrinsically weak adherence to the resin usually employed for the coating in the bottom of the cavity, and even to the adhesive for fixing the module to the periphery of the cavity. This is because, starting from a material of this kind with an intrinsically low surface energy, a better correlation is obtained between the setting parameters of the surface treatment means and the adherence obtained after surface treatment. Moreover, as explained later, materials known for their low surface energy, and relatively little used until now in the field of microcircuit cards for this reason, also have the best mechanical strength and thermal characteristics, which offers the prospect of a longer service life of the microcircuit card.

By way of nonlimiting example, the card body can be made so that at least the bottom of the cavity consists of polyethylene terephthalate (PET), polycarbonate or polybutylene terephthalate (PBT). It is not necessary for the whole of the card body to be made from a material of this kind. For example, if the card body is made by laminating a plurality of layers of plastic materials, possibly different materials, it will suffice for the layer at the depth of the bottom of the cavity to be of a plastic material with a low surface energy, for example one of the materials mentioned above. In the case of PET, polyethylene terephthalate film (PETF) in particular may be used.

If the card body is made in this way, i.e. by laminating a plurality of films, the cavity can be produced after lamination, by machining into the thickness of said card body, taking care that this operation is effected to the correct depth to expose the low surface energy plastic material, so that the latter forms the bottom of the cavity. Of course, the machining may be carried out on a one-piece card body, i.e. one made from a solid block of low surface energy plastic material. Another possibility is to mold the card body, in which case the cavity may be formed during molding. The plastic material used for the molding process is chosen for its low surface energy and is one of the materials indicated above, for example.

The surface treatment may comprise laser beam treatment generating mechanical and/or chemical modifications of the treated surface. Good results are obtained with a YAG laser beam generator or a $CO_2$ laser beam generator.

The treatment may consist in chemical modification of the bottom surface by exposure to ultraviolet rays, for example by means of a lamp, possibly associated with laser treatment using an excimer laser beam generator emitting in the ultraviolet band. Excimer lasers, in particular argon-fluorine and xenon-chlorine lasers, may be used for this purpose.

The surface state of the cavity may also be modified by plasma treatment using a specific gas or in the open air (corona treatment). This type of treatment is reflected in chemical modification of the surface.

Laser treatment has the advantage of combining chemical modifications with the creation of microcavities which encourage increased adherence of the resin.

The operating parameters of the treatment means indicated above may be adjusted precisely to control the modification of the surface state of a plastic material and more particularly of a low surface energy plastic material.

After the operation of adjusting the surface state referred to above, the method is completed in a manner that is known in the art by depositing a required quantity of resin onto the bottom of the cavity treated in this way and placing the module in the cavity so that its microcircuit is surrounded by the liquid resin. The resin is then polymerized. Depending on the type of resin used, polymerization may be obtained by heat treatment or by ultraviolet irradiation followed by heat treatment after mounting the module. The adhesive used to fix the module to the peripheral flat of the cavity may be a cold adhesive or a heat-activated adhesive. After polymerization, resin adheres both to the interior surface of the module and to that of the treated cavity. However, the adherence of the resin to the module is much lower than the adherence of the same resin to the bottom of the cavity. This results in destruction of the module in the event of an attempt to extract it.

BRIEF DESCRIPTION OF THE DRAWINGS

The invention will be better understood and its other advantages will become more clearly apparent in the light of the following description of one embodiment of the method conforming to the invention, which is given by way of example only and with reference to the appended drawings, in which:

FIG. 1a shows a variant of the FIG. 1 step;

FIG. 4 shows the finished card; and

FIG. 5 shows destruction of the module in the event of a fraudulent attempt to extract it.

DESCRIPTION OF THE PREFERRED EMBODIMENTS

Figure 1:
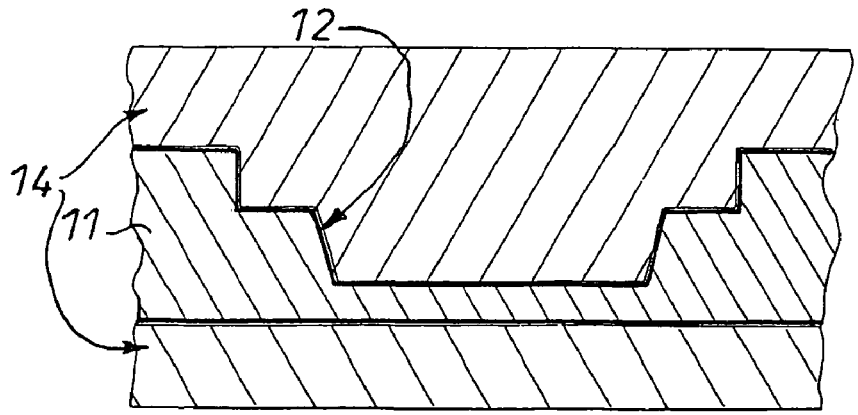
FIG. 1 is a diagram showing the fabrication of the card body and the cavity.

The method of the invention comprises the successive operations shown in FIGS. 1 to 5. In FIG. 1, a card body 11 is formed from a plastic material having a low surface energy. In this example, the card body is molded and a cavity 12 is formed during the molding operation by the particular shape of one of the components of the mold 14. As shown in FIG. 1a, 1f the card body 11a is cut out from a thin sheet of plastic material, the cavity 12a may be formed by mechanical machining. As previously indicated, if the card body is made by laminating a plurality of films of different plastic materials, then the film at the maximum machining depth may be of a low surface energy plastic material since this film, constituting the bottom of the cavity, must undergo the treatment envisaged.

Figure 2:
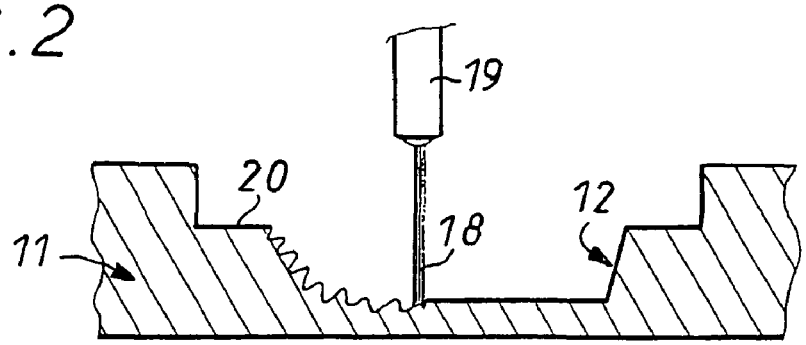
FIG. 2 shows surface treatment of the bottom of the cavity.

FIG. 2 depicts diagrammatically one of these surface treatments, namely exposure of at least the bottom 16 of the cavity 12 to a laser beam 18 produced by a generator 19, for example a YAG generator. In the example shown, the cavity comprises a peripheral flat 20 on which the edge of the module rests. This peripheral flat may be subjected to the same treatment.

Figure 3:
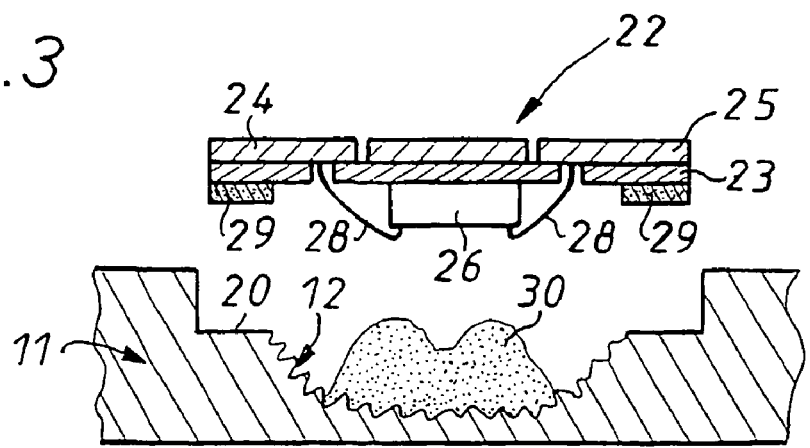
FIG. 3 shows implanting a microcircuit module in the cavity.

FIG. 3 shows a standard module 22 consisting of a support film 23 forming a printed circuit defining metal connecting lands 24, 25. A microcircuit 26 is stuck to the other side of the printed circuit. Its inputs-outputs are connected by wires 28 to the various connecting lands of the printed circuit. A heat-activated adhesive 29 is deposited at the periphery of the face of the support film 23 that carries the microcircuit 26. A predetermined quantity of resin is also deposited in the cavity and the module 22 is positioned in the cavity so that the microcircuit is surrounded by the still liquid resin. The adhesive 29 remains on the peripheral flat 20 of the cavity. When the module has been installed in this way, the still liquid resin fills substantially all of the cavity or at least a major portion thereof. The resin is in particular in contact with the interior face of the support film 23 all around the microcircuit. The resin surrounds the microcircuit. This situation is depicted in FIG. 4. When the resin is polymerized, the module adheres perfectly to the card body 11. In the event of an attempt at fraud, the resin 30 coating the microcircuit 26 and its connection wires 28 remain stuck to the bottom of the cavity, whereas the support film 23 of the module is detached from the resin, leading to separation of the connecting wires 28 and the microcircuit 26, on the one hand, from the electrical connection lands 25, on the other hand. The module therefore becomes unusable and may not be installed in another card body.

The invention claimed is:

1. A method of making a microcircuit card comprising a card body (11) and a module (22) comprising a support film (23) forming a printed circuit carrying a microcircuit (26) on one of its faces, the method comprising the steps of:
    providing the card body with a cavity having a bottom and a sidewall;
    surface treating at least an entirety of the bottom of the cavity to increase adherence of a predetermined resin to the bottom;
    depositing a required quantity of resin;
    positioning the module in the cavity so that the microcircuit is surrounded by the resin; and
    polymerizing the resin, the resin filling at least a part of the cavity so as to adhere to the bottom and surround the microcircuit,
    said surface treating being such that the adherence of the resin to the bottom is greater than adherence of the resin to the support film of the module, whereby the microcircuit is separated from the support film when a fraudulent attempt is made to remove the module from the card body.

2. Method according to claim 1, wherein the microcircuit is electrically connected to lands of the printed circuit.

3. Method according to claim 1, wherein the cavity is open.

4. Method according to claim 3, wherein the module adheres to a peripheral flat between an open side of the cavity and the bottom of the cavity.

5. Method according to claim 2, wherein the microcircuit adheres to a side of the printed circuit opposite the lands.

6. The method according to claim 1, wherein the card body is made from a plastic material having a surface energy of less than 45 mN/m.

7. The method according to claim 6, wherein the bottom consists of polyethylene terephthalate (PET).

8. The method according to claim 6, wherein the bottom consists of polycarbonate.

9. The method according to claim 6, wherein the bottom consists of polybutylene terephthalate (PBT).

10. The method according to claim 1, wherein the step of providing the card body comprises laminating a plurality of layers, and wherein the bottom is one these layers that consists of a plastic material having a surface energy of less than 45 mN/m.

11. The method according to claim 1, wherein the step of providing the card body comprises machining the cavity into a thickness of the card body.

12. The method according to claim 1, wherein the step of providing the card body comprises obtaining the card body by molding and wherein the cavity is formed during the molding.

13. The method according to claim 1, wherein the surface treatment step includes a laser treatment generating at least one of mechanical and chemical modification.

14. The method according to claim 1, wherein the surface treatment step includes a laser treatment.

15. Method according to claim 14, wherein the laser treatment is carried out with a YAG laser beam generator (19).

16. Method according to claim 14, wherein the laser treatment is carried out with an excimer laser beam generator.

17. The method according to claim 1, wherein the surface treatment step includes a gas plasma treatment.

18. The method according to claim 1, wherein the surface treatment step includes a corona treatment.

19. The method according to claim 1, wherein the surface treatment step includes an ultraviolet treatment.

20. The method according to claim 1, wherein the surface treatment step includes a roughening surface treatment.

21. The method according to claim 20, wherein the roughening surface treatment includes a laser treatment.

22. The method according to claim 20, wherein the roughening surface treatment includes one of a gas plasma treatment and a corona treatment.

23. The method according to claim 1, wherein the step of providing the card body comprises providing the cavity with an upper part that receives the module and a lower part with the bottom and the sidewall, wherein the fixing step includes filling an entirety of the lower part of the cavity with the resin, and wherein the surface treatment step includes roughening an entirety of the bottom and the sidewall of the lower part of the cavity.

24. The method according to claim 1, wherein the step of surface treating includes generating one of mechanical and chemical modifications.

25. The method according to claim 1, wherein the step of depositing a required quantity of the resin comprises depositing at least a part of the resin on treated bottom.

26. Method of making a microcircuit card that includes a card body and a module with a support film forming a printed circuit and carrying a microcircuit connected to the printed circuit, the method comprising the steps of:
   forming a cavity in the card body, the cavity having an upper part adapted to receive the module and a lower part adapted to receive the microcircuit, the lower part having a bottom and a sidewall;
   roughening an entirety of the bottom and the sidewall of the lower part of the cavity;
   filling an entirety of the lower part of the cavity with a resin;
   positioning the module in the cavity so that the resin surrounds and adheres to the microcircuit and contacts and adheres to the support film; and
   polymerizing the resin,
   wherein the roughening increases adherence of the resin to the entirety of the bottom and the sidewall of the cavity to be greater than adherence of the resin to the support film.

* * * * *